(12) United States Patent
Chang et al.

(10) Patent No.: US 8,363,505 B2
(45) Date of Patent: Jan. 29, 2013

(54) LOCAL WORD LINE DRIVER

(75) Inventors: Chin-Hung Chang, Tainan (TW); Wen-Chiao Ho, Tainan (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 396 days.

(21) Appl. No.: 12/785,297

(22) Filed: May 21, 2010

(65) Prior Publication Data

US 2011/0149675 A1  Jun. 23, 2011

(30) Foreign Application Priority Data

Dec. 17, 2009  (TW) ............................... 98143429 A (51) Int. Cl.
*G11C 8/08* (2006.01)

(52) U.S. Cl. ..................................... 365/230.06; 365/23

(58) Field of Classification Search ............. 365/185.13, 365/185.18, 185.23, 230.06

See application file for complete search history.

(56) References Cited

U.S. PATENT DOCUMENTS

| | | | | |
|---|---|---|---|---|
| 4,085,498 | A * | 4/1978 | Rideout | 438/241 |
| 4,737,936 | A * | 4/1988 | Takeuchi | 365/185.22 |
| 6,025,751 | A * | 2/2000 | Chiang et al. | 327/589 |
| 7,177,226 | B2 | 2/2007 | Lee | |
| 2007/0030738 | A1* | 2/2007 | Oh | 365/189.01 |
| 2007/0278554 | A1* | 12/2007 | Song et al. | 257/314 |
| 2008/0144389 | A1 | 6/2008 | Chen et al. | |
| 2010/0142306 | A1* | 6/2010 | Nakamura et al. | 365/227 |

* cited by examiner

*Primary Examiner* — Douglas King
(74) *Attorney, Agent, or Firm* — Kenta Suzue; Haynes Beffel & Wolfeld LLP

(57) ABSTRACT

A two transistor word line driver is disclosed. An example disclosed word line driver is simplified with common signals on the gates of the p-type and the n-type transistors. An example disclosed word line driver consumes less power by applying a negative voltage to a word line driver selected from multiple word line drivers.

23 Claims, 9 Drawing Sheets

2T Driver (1 per Row)

Fig. 1

2T Driver (1 per Row)

|      | Read/PGM |        |        | ERS  |        |
|------|----------|--------|--------|------|--------|
|      | SEL      | DE-SEL | DE-SEL | SEL  | DE-SEL |
| NWD  | AVXP     | AVXP   | AVXP   | AVXP | AVXP   |
| GWL  | AVXP     | 0V     | AVXP   | 0V   | 0V     |
| PP   | -2V      | -2V    | AVXP   | AVXP | AVXP   |
| NVS  | 0V       | 0V     | 0V     | -V   | 0V     |
| WL   | AVXP     | 0V     | 0V     | -V   | 0V     |

Fig. 4

|      | Read/PGM |        |        | ERS  |        |
|------|----------|--------|--------|------|--------|
|      | SEL      | DE-SEL | DE-SEL | SEL  | DE-SEL |
| NWD  | AVXP     | AVXP   | AVXP   | AVXP | AVXP   |
| GWL  | AVXP     | 0V     | AVXP   | 0V   | 0V     |
| PP   | 0V       | 0V     | AVXP   | AVXP | AVXP   |
| NVS  | 0V       | 0V     | 0V     | -V   | 0V     |
| WL   | AVXP     | 0V     | 0V     | -V   | 0V     |

Fig. 5

|  | Read | | | | PGM | | | | ERS | |
|---|---|---|---|---|---|---|---|---|---|---|
|  | SEL | DE-SEL | SEL | DE-SEL | SEL | DE-SEL | SEL | DE-SEL | SEL | DE-SEL |
| NWD | AVXRD | AVXRD |  |  | AVXHV | AVXHV |  |  | AVXEV | AVXEV |
| GWL | AVXRD | 0V |  |  | AVXHV | 0V |  |  | 0V | 0V |
| PP | AVXNV | AVXNV |  |  | AVXNV | AVXNV |  |  | AVXEV | AVXEV |
| NVS | 0V | 0V |  |  | 0V | 0V |  |  | NV | 0V |
| WL | AVXRD | 0V |  |  | AVXHV | 0V |  |  | NV | 0V |

LOCAL WORD LINE DRIVER

BACKGROUND

1. Field of the Invention

The technology relates to memory integrated circuits, in particular the word line driver of a memory integrated circuit.

2. Description of Related Art

Memory integrated circuits access memory cells with word lines powered by word line drivers. With the continuing trend towards decreasing die size and more stringent power requirements, two transistor, or 2T, word line drivers are another alternative.

However, known 2T word line drivers are complicated and consume too much power. For example, the 2T word line driver design of US Patent Application Publication 2008/0144389 requires a different set of biases for the gates of the two transistors. In another example, the 2T word line driver design of U.S. Pat. No. 7,177,226 suffers from leakage current for a selected word line driver.

SUMMARY

One aspect of the technology is a memory circuit apparatus, or memory integrated circuit. The memory integrated circuit includes multiple word line drivers electrically connected to multiple word lines, and control circuitry.

The multiple word line drivers receive a first word line selection signal and a second word line selection signal, such as the PP and GWL signals shown in examples. The first word line selection signal and the second word line selection signal together select a word line from the multiple word lines. A word line driver includes a p-type transistor and an n-type transistor.

The p-type transistor has a gate receiving the second word line selection signal; a first current carrying terminal receiving the first word line selection signal; and a second current carrying terminal electrically connected to an output terminal.

The n-type transistor has a gate electrically connected to the gate of the p-type transistor and receiving the second word line selection signal; a first current carrying terminal; and a second current carrying terminal electrically connected to the output terminal.

The output terminal of the word line driver is electrically connected to the second current carrying terminal of the p-type transistor and the second current carrying terminal of the n-type transistor. The output terminal drives a corresponding word line.

The control circuitry applies bias arrangements to the word line drivers, including a first bias arrangement applying a nonpositive voltage as the second word line selection signal selecting the word line electrically connected to the word line driver.

In some embodiments, the p-type transistor turns on with only negative gate voltage.

In some embodiments, the depletion mode p-type transistor turns on with nonpositive gate voltage.

In some embodiments, word line drivers have a total of two transistors.

In some embodiments, the n-type transistor is in a p-type well, and the p-type well and the p-type transistor are in an n-type well.

In some embodiments, the bias arrangements of the control circuitry include a second bias arrangement deselecting the word line electrically connected to the word line driver, by applying a negative voltage as the second word line selection signal.

In some embodiments, the bias arrangements of the control circuitry include a second bias arrangement deselecting the word line electrically connected to the word line driver, by applying a positive voltage as the second word line selection signal.

In some embodiments, the bias arrangements of the control circuitry include a second bias arrangement deselecting the word line electrically connected to the word line driver, by applying a negative voltage as the second word line selection signal. The bias arrangements of the control circuitry include a third bias arrangement deselecting the word line electrically connected to the word line driver, by applying a positive voltage as the second word line selection signal.

In some embodiments, the p-type transistor turns on with nonpositive gate voltage. The bias arrangements of the control circuitry include a second bias arrangement deselecting the word line electrically connected to the word line driver, by applying a zero voltage as the second word line selection signal.

In some embodiments, the p-type transistor turns on with nonpositive gate voltage. The bias arrangements of the control circuitry include a second bias arrangement deselecting the word line electrically connected to the word line driver, by applying a zero voltage as the second word line selection signal. The bias arrangements of the control circuitry include a third bias arrangement deselecting the word line electrically connected to the word line driver, by applying a positive voltage as the second word line selection signal.

Some embodiments include a negative standby pump generating a negative voltage as the second word line selection signal.

Another aspect of the technology is a method including the following steps:

receiving on a memory integrated circuit, at a word line driver electrically connected to a word line, a first word line selection signal and a second word line selection signal, the first word line selection signal and the second word line selection signal together selecting the word line from a plurality of word lines, the second word line selection signal having a nonpositive voltage, including:
  receiving the second word line selection signal at an input terminal electrically connected to a gate of a p-type transistor of the word line driver and a gate of an n-type transistor of the word line driver, the gate of the p-type transistor electrically connected to the gate of the n-type transistor;
  receiving the first word line selection signal at a first current carrying terminal of the p-type transistor;
sending on the memory integrated circuit, an output signal from an output terminal of the word line driver to select the word line electrically connected to the word line, the output terminal being electrically connected to a second terminal of the p-type transistor and a second terminal of the n-type transistor.

Another aspect of the technology is a memory circuit apparatus, or memory integrated circuit. The memory integrated circuit includes:
  means for receiving, at a word line driver electrically connected to a word line, a first word line selection signal and a second word line selection signal, the first word line selection signal and the second word line selection signal together selecting the word line from a plurality of word lines, the second word line selection signal having a nonpositive voltage, including:

means for receiving the second word line selection signal at an input terminal electrically connected to a gate of a p-type transistor of the word line driver and a gate of an n-type transistor of the word line driver, the gate of the p-type transistor electrically connected to the gate of the n-type transistor;

means for receiving the first word line selection signal at a first current carrying terminal of the p-type transistor; and means for sending an output signal from an output terminal of the word line driver to select the word line electrically connected to the word line, the output terminal being electrically connected to a second terminal of the p-type transistor and a second terminal of the n-type transistor.

Various embodiments of the aspects are disclosed herein.

DETAILED DESCRIPTION

Figure 1:
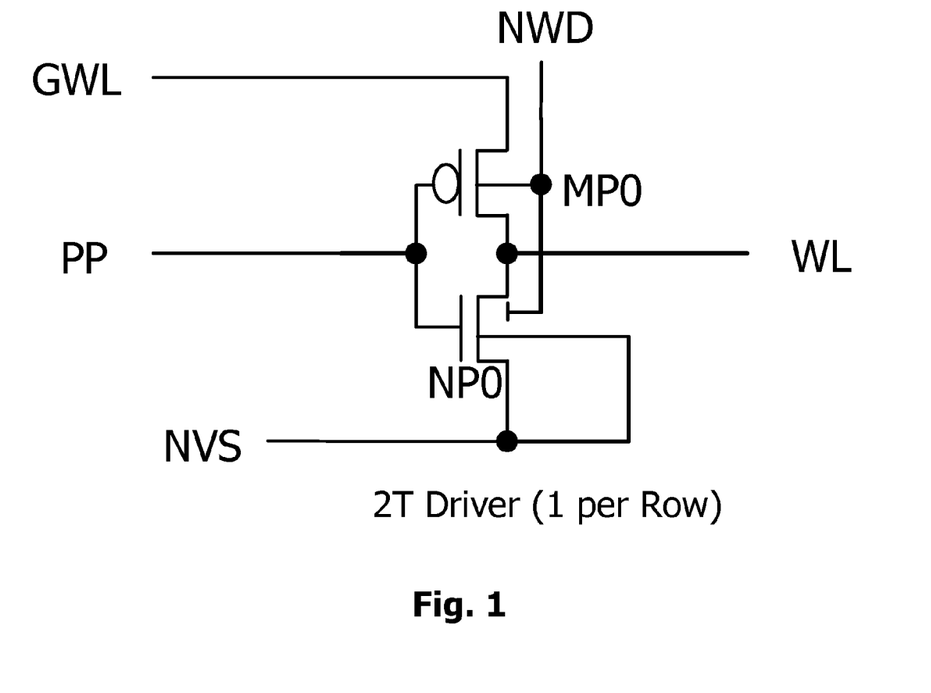
FIG. 1 shows a circuit diagram of a 2T word line driver as an example of the technology with an n-type transistor and a p-type transistor, where the p-type transistor to turns on with only negative gate voltage.

FIG. 1 shows a circuit diagram of a 2T word line driver as an example of the technology with an n-type transistor and a p-type transistor, where the p-type transistor to turns on with only negative gate voltage.

One 2T word line driver corresponds to one word line in the memory array.

Transistor MP0 is a p-type transistor. Transistor NP0 is an n-type transistor. Both transistors have a source and a drain which are the current carrying terminals, and a gate. The gates of p-type transistor MP0 and n-type transistor NP0 are electrically connected to each other, and to signal PP which is one of two address signals selecting a particular word line corresponding to a particular word line driver. The drains of p-type transistor MP0 and n-type transistor NP0 are electrically connected to each other, and to the word line WL driven by this word line driver. The source of p-type transistor MP0 is electrically connected to signal GWL, which is another one of two address signals selecting a particular word line corresponding to a particular word line driver. The source of n-type transistor NP0 is electrically connected to signal NVS; signal NVS is also electrically connected to the p-well of the n-type transistor NP0. The p-well of the n-type transistor NP0 is formed in an n-well, in which the p-type transistor MP0 is formed. This n-well is electrically connected to signal NWD.

Figure 2:
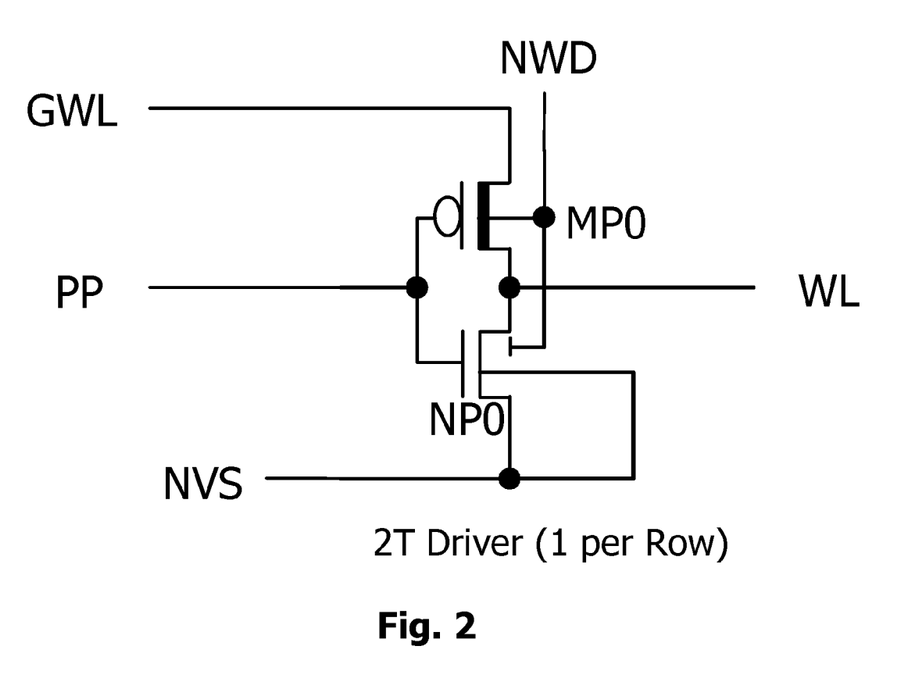
FIG. 2 shows a circuit diagram of a 2T word line driver as an example of the technology with an n-type transistor and a depletion mode p-type transistor, where the p-type transistor turns on with non-positive gate voltage.

FIG. 2 shows a circuit diagram of a 2T word line driver as an example of the technology with an n-type transistor and a p-type transistor, where the p-type transistor turns on with non-positive gate voltage. FIG. 2 is similar to FIG. 1. However, the symbol for the p-type transistor MP0 indicates a depletion mode device rather than an enhancement device. Accordingly, the depletion mode p-type transistor MP0 of FIG. 2 is on at 0V on the gate, whereas the enhancement mode p-type transistor MP0 of FIG. 1 is off at 0V on the gate. More particularly, the depletion mode p-type transistor MP0 of FIG. 2 is on at least at 0V and at negative voltages on the gate, and turns off with some positive voltage range on the gate, and some transition between 0V and this positive voltage range. The enhancement mode p-type transistor MP0 of FIG. 1 is off at 0V and at positive voltages on the gate, and turns on with some negative voltage range on the gate, and some transition between 0V and this negative voltage range.

Figure 3:
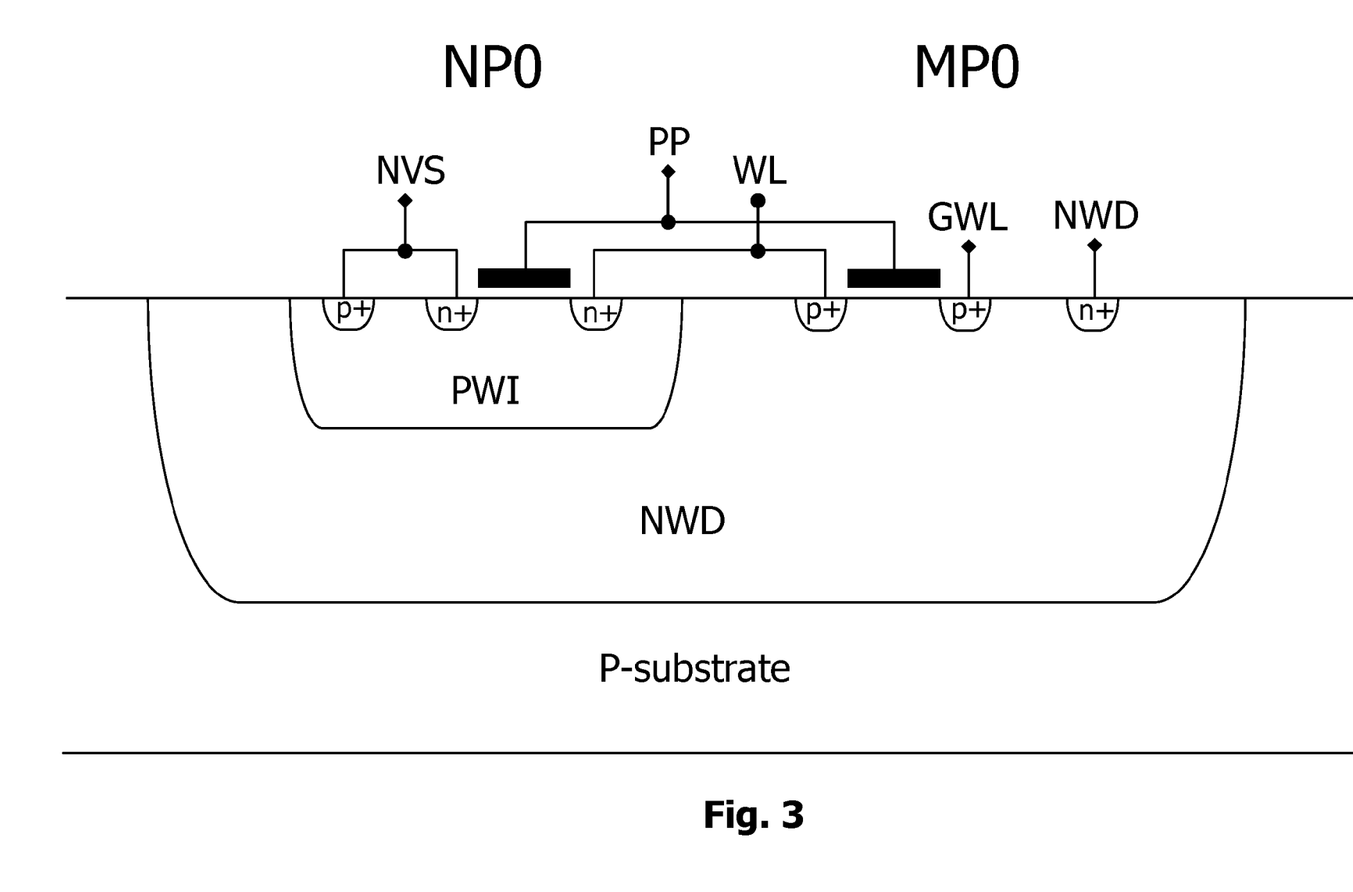
FIG. 3 is a depth cross-section of the 2T word line driver, showing the five voltage nodes of the 2T word line driver.

FIG. 3 is a depth cross-section of the 2T word line driver, showing the five voltage nodes of the 2T word line driver. The p-well implant PWI in the n-well diffusion NWD is shown. The n-well diffusion NWD is formed in the p-type substrate. The n-type transistor NP0 is formed in the p-well implant PWI. The p-type transistor MP0 is formed in the n-well diffusion NWD.

Figure 4:
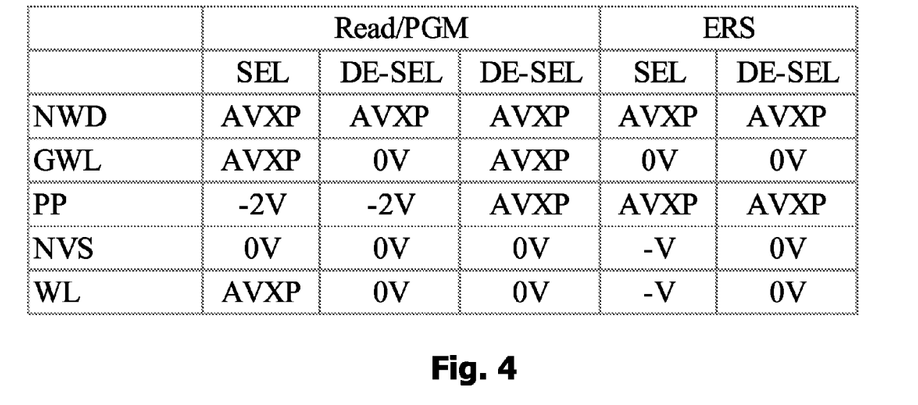
FIG. 4 is a table of an example bias arrangement for the five nodes of the 2T word line driver shown in FIG. 1.

FIG. 4 is a table of an example bias arrangement for the five nodes of the 2T word line driver shown in FIG. 1. The bias arrangements are divided into read or program bias arrangements, and erase bias arrangements. The bias arrangements are further divided into word line select and word line de-select bias arrangements.

Both signal PP and signal GWL are address signals that select or deselect a particular word line corresponding to a particular word line driver. Both signal PP and signal GWL must select a particular word line corresponding to a particular word line driver. De-select occurs if either signal PP or signal GWL de-selects a particular word line corresponding to a particular word line driver. Accordingly, two de-select bias arrangements are shown among the read or program bias arrangements.

In the first de-select read or program bias arrangement, signal GWL de-selects. The negative PP signal turns off n-type transistor NP0 and turns on p-type transistor MP0. The p-type transistor MP0 electrically connects the signal GWL to the de-selected word line WL.

In the second de-select read or program bias arrangement, signal GWL de-selects. The positive AVXP signal turns on n-type transistor NP0 and turns off p-type transistor MP0. The n-type transistor NP0 electrically connects the signal NVS to the de-selected word line WL.

Figure 5:
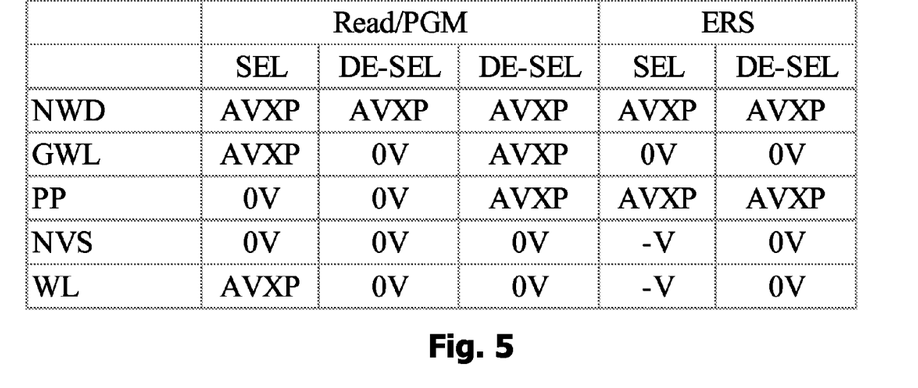
FIG. 5 is a table of another example bias arrangement for the five nodes of the 2T word line driver shown in FIG. 2.

FIG. 5 is a table of another example bias arrangement for the five nodes of the 2T word line driver shown in FIG. 2. This table is similar to the table of FIG. 4. However, among the read or program bias arrangements, for both the select bias arrangement and the first de-select read or program bias arrangement, the signal PP is 0 V instead of −2 V. The table of FIG. 5 corresponds to the 2T word line driver of FIG. 2, with a depletion mode p-type transistor MP0, rather than an enhance mode p-type device. Accordingly, 0V for the signal PP is sufficient to turn on p-type transistor MP0. This contrasts with the table of FIG. 4 which corresponds to the 2T word line driver of FIG. 1, with an enhance mode p-type transistor MP0, and requires a negative voltage such as −2V to turn on p-type transistor MP0.

Figure 6:
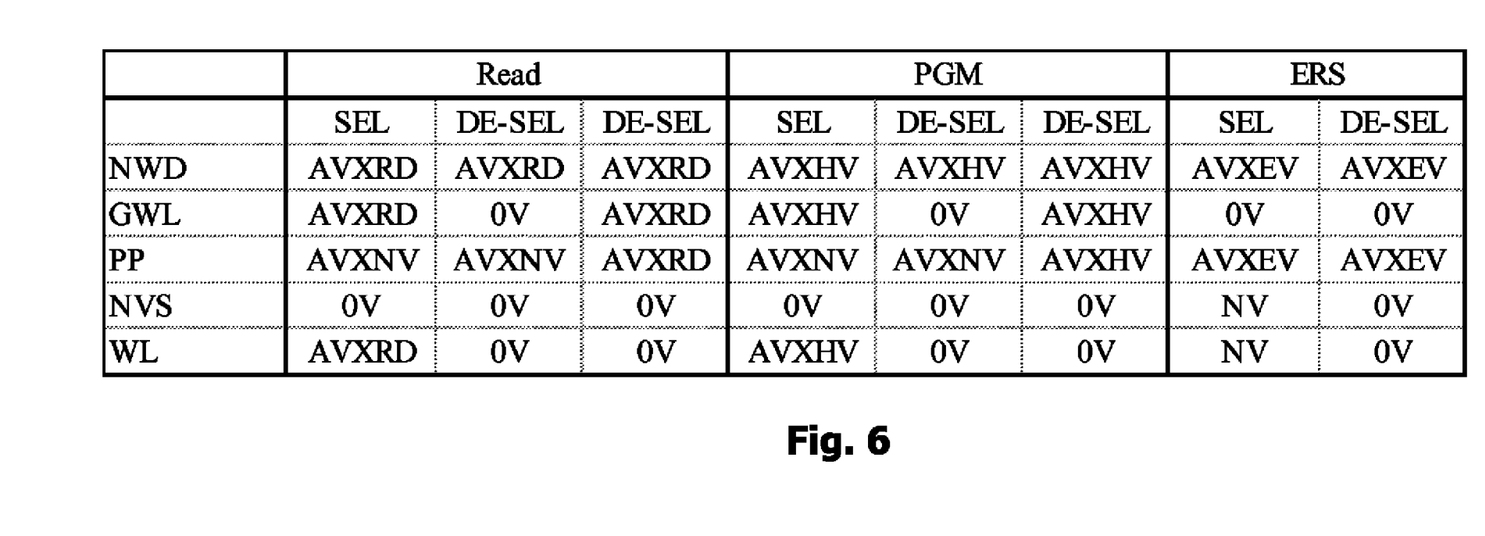
FIG. 6 is a table of yet anther example bias arrangement for the 2T word line driver, with a generalized negative voltage.

FIG. 6 is a table of yet anther example bias arrangement for the 2T word line driver, with a generalized negative voltage.

The signal and node abbreviations and associated voltage ranges are explained as follows:
AVXRD: WL voltage level for read
AVXHV: WL voltage level for program
AVXEV: WL voltage level for erase-verify
AVXNV: −1~−3V from standby negative pump
NV: −8~−11V for erase
AVXP: WL power source
GWL: Global WL power node
PP: PMOS pass gate signal
NVS: negative voltage source FIG. 7 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

Figure 7:
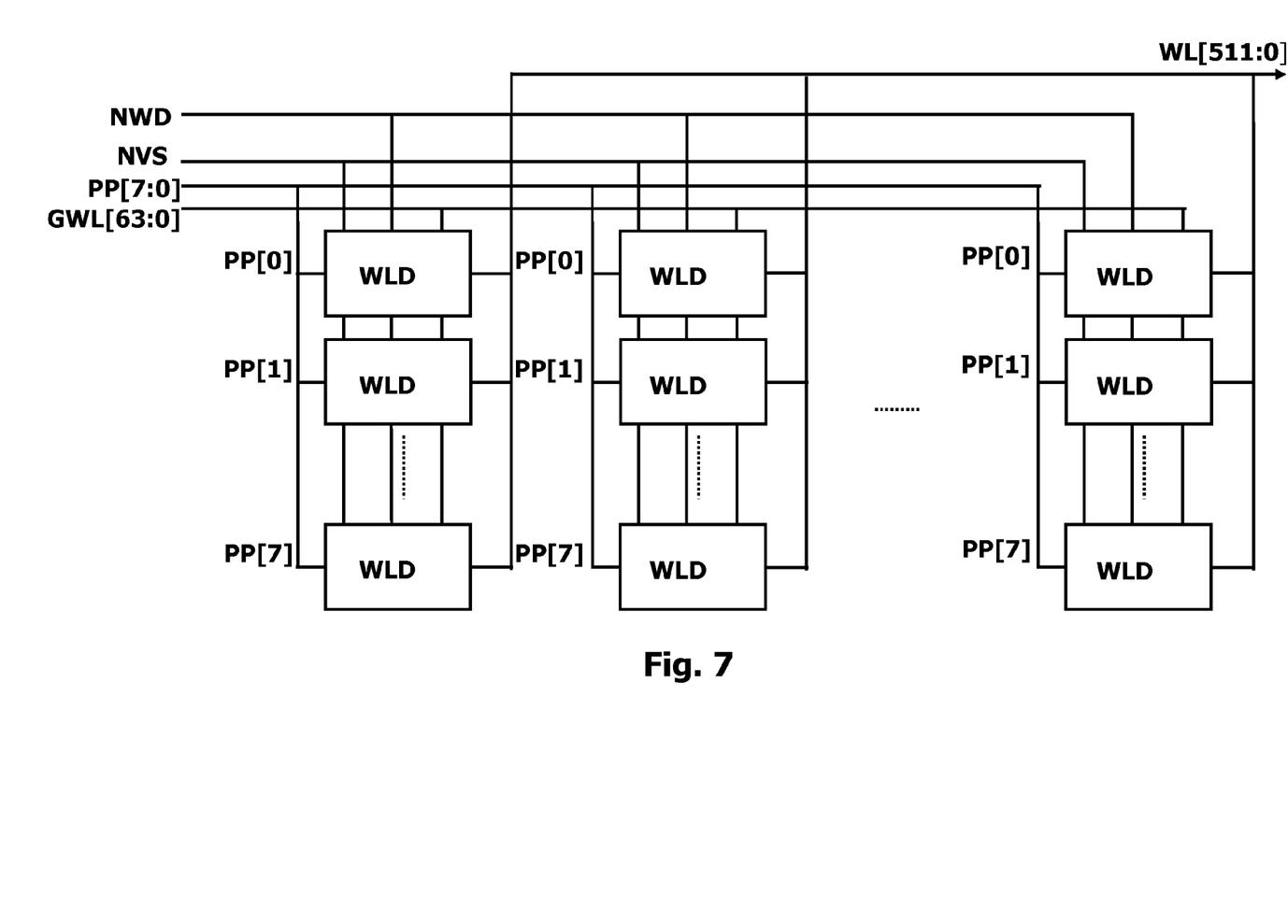
FIG. 7 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

The 2T word line driver array is illustrated in FIG. 7 with 64 WLD columns, sharing the same GWL signal but having different PP signals within a column; and with 8 WLD rows sharing the same PP signal but having different GWL signals within a row.

Figure 8:
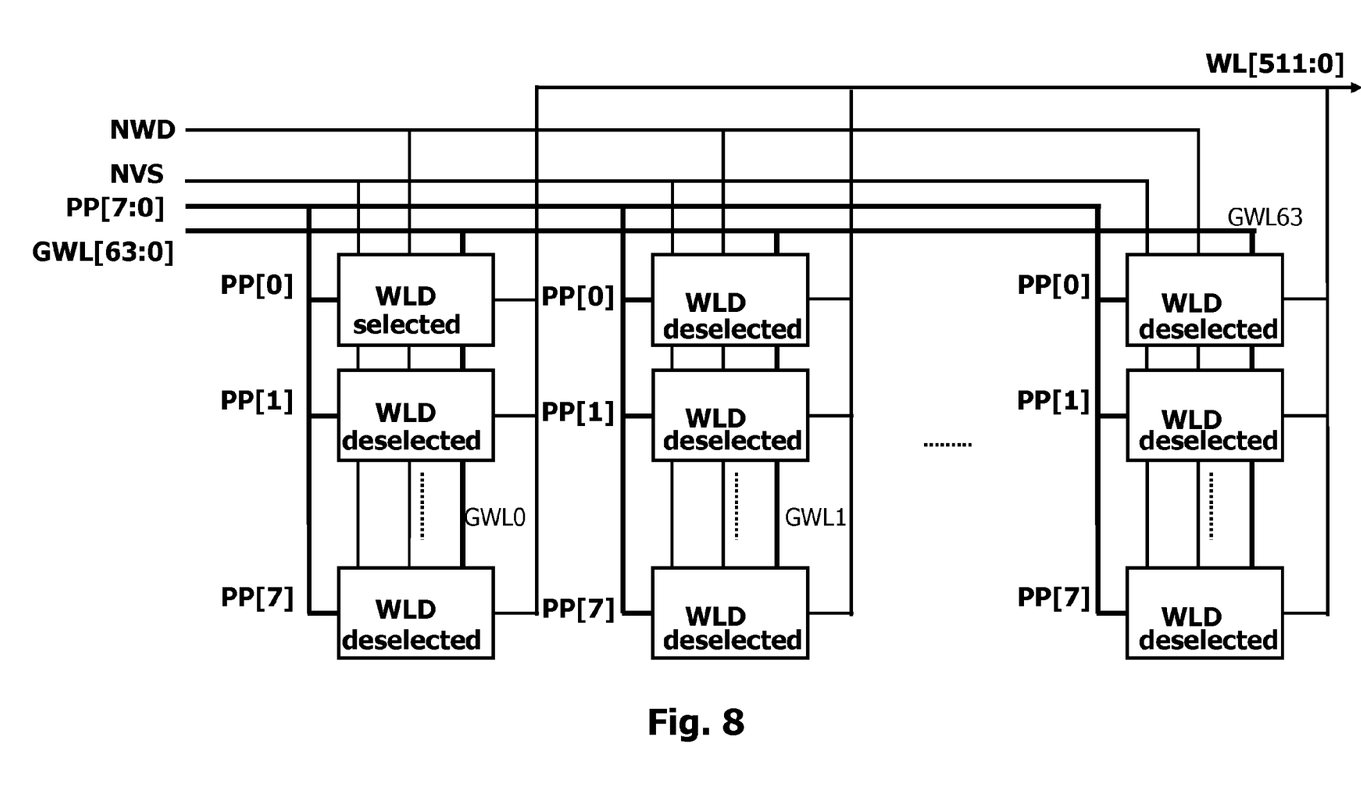
FIG. 8 is the simplified block diagram of an array of 2T word lines drivers of FIG. 7, showing an example addressing arrangement that selects a particular 2T word lines driver from the array, and deselects other 2T word lines driver according to two separate address lines.

FIG. 8 is the simplified block diagram of an array of 2T word lines drivers of FIG. 7, showing an example addressing arrangement that selects a particular 2T word lines driver from the array, and deselects other 2T word lines driver according to two separate address lines.

Both signal PP and signal GWL must select a particular word line corresponding to a particular word line driver. The 2T word line driver array is illustrated in FIG. 7 has signal PP[0] and GWL0 selecting the upper left word line driver, along with the word line corresponding to this word line driver. All other word line drivers (and their corresponding word lines) are deselected.

Figure 9:
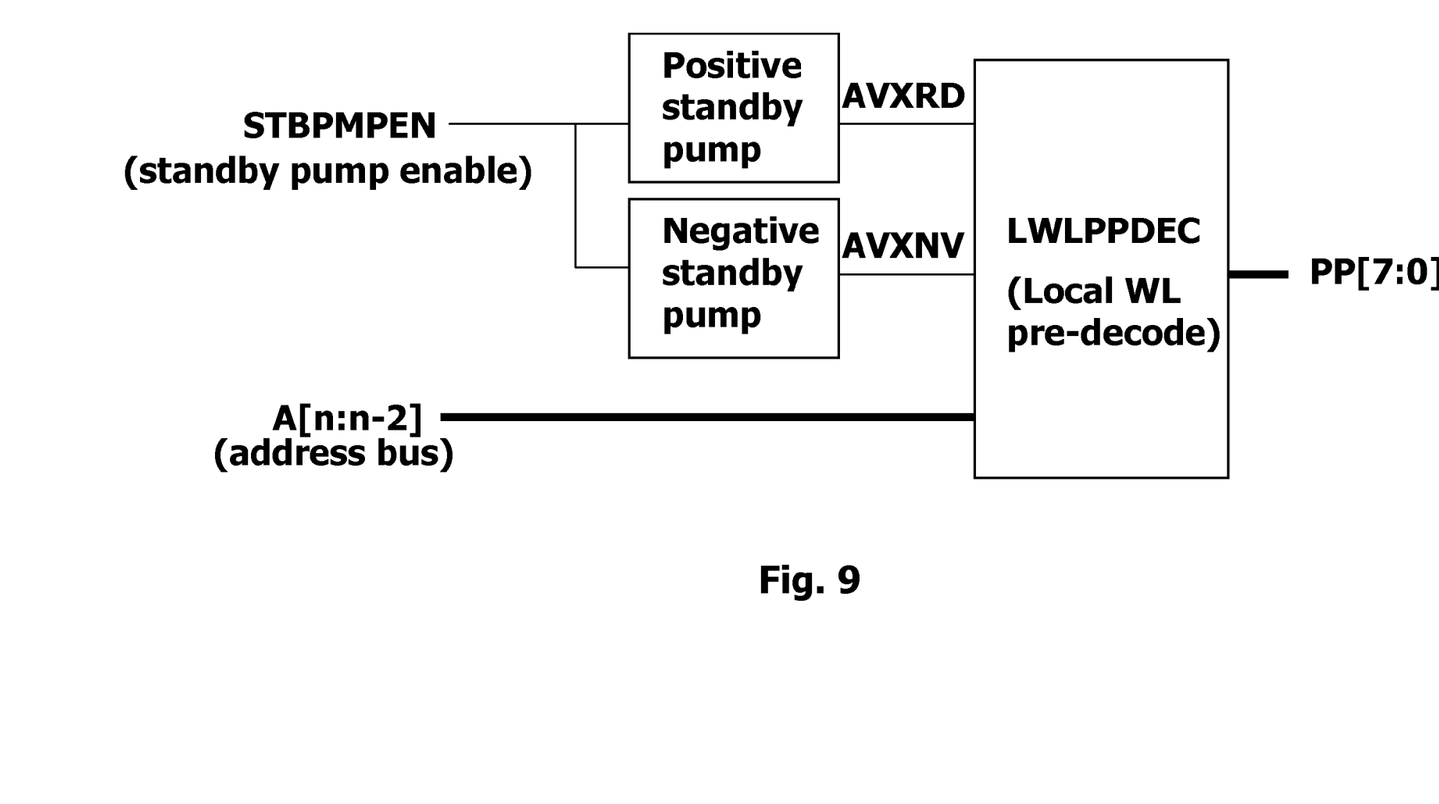
FIG. 9 is the simplified block diagram showing the positive and negative standby pumps that drive the array of 2T word lines drivers.

FIG. 9 is the simplified block diagram showing the positive and negative standby pumps that drive the array of 2T word lines drivers.

Signal STBPMPEN enables or disables the standby pumps. A positive standby pump generates signal AVXRD. A negative standby pump generates signal AVXNV. The negative standby pump is included if read mode does not have sufficient latency for generating negative voltage, and turns on p-type transistor MP0 with a negative voltage. In other words, the negative standby pump is not necessary if the p-type transistor MP0 is depletion mode. An address signal on an address bus is decoded by LWLPPDEC, which performs pre-decoding for local word lines and generates signals PP[7:0].

Figure 10:
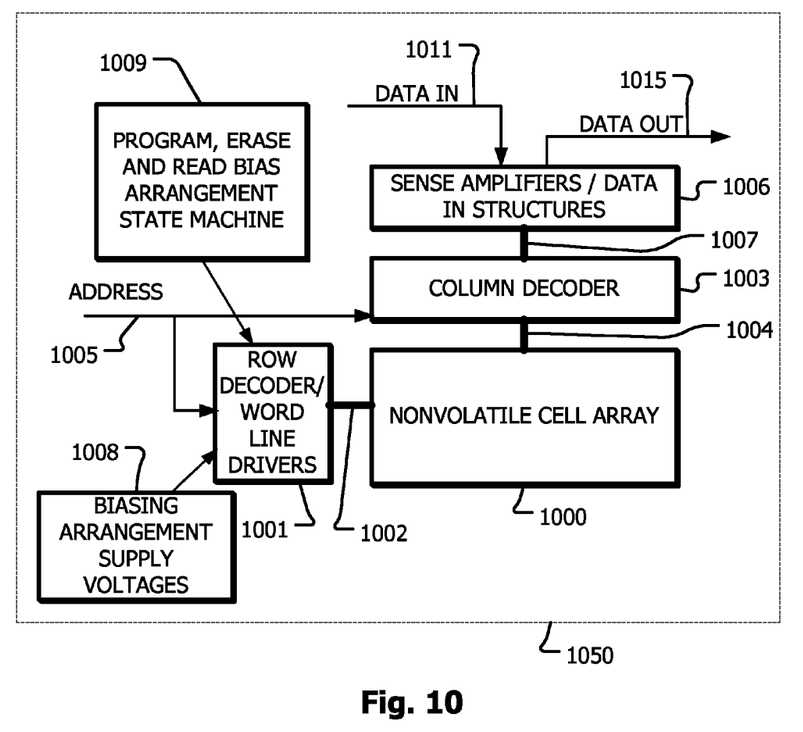
FIG. 10 is a simplified block diagram of an integrated circuit including a memory array implemented using any of the 2T word line driver improvements as described herein.

FIG. 10 is a simplified block diagram of an integrated circuit including a memory array implemented using any of the 2T word line driver improvements as described herein.

FIG. 10 is a simplified block diagram of an integrated circuit 1050 including a memory array 1000. A word line (or row) and block select decoder 1001 is coupled to, and in electrical communication with, a plurality 1002 of word lines and string select lines, and arranged along rows in the memory array 1000. A bit line (column) decoder and drivers 1003 are coupled to and in electrical communication with a plurality of bit lines 1004 arranged along columns in the memory array 1000 for reading data from, and writing data to, the memory cells in the memory array 1000. Addresses are supplied on bus 1005 to the word line decoder and drivers 1001 and to the bit line decoder 1003. Sense amplifiers and data-in structures in block 1006, including current sources for the read, program and erase modes, are coupled to the bit line decoder 1003 via the bus 1007. Data is supplied via the data-in line 1011 from input/output ports on the integrated circuit 1050, to the data-in structures in block 1006. Data is supplied via the data-out line 1015 from the sense amplifiers in block 1006 to input/output ports on the integrated circuit 1050, or to other data destinations internal or external to the integrated circuit 1050. State machine and improved clock circuitry are in circuitry 1009, controlling biasing arrangement supply voltages 1008.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory circuit apparatus, comprising:
a plurality of word line drivers electrically connected to a plurality of word lines on a memory integrated circuit, the plurality of word line drivers receiving a first word line selection signal and a second word line selection signal, the first word line selection signal and the second word line selection signal together selecting a word line from the plurality of word lines, a word line driver of the plurality of word line drivers comprising:
a depletion mode p-type transistor having:
a gate receiving the second word line selection signal;
a first current carrying terminal receiving the first word line selection signal; and
a second current carrying terminal electrically connected to an output terminal;
a n-type transistor having:
a gate electrically connected to the gate of the p-type transistor and receiving the second word line selection signal;
a first current carrying terminal; and
a second current carrying terminal electrically connected to the output terminal; and
the output terminal electrically connected to the second current carrying terminal of the p-type transistor and the second current carrying terminal of the n-type transistor, the output terminal driving a corresponding word line of the plurality of word lines; and
control circuitry applying bias arrangements to the plurality of word line drivers, including a first bias arrangement applying a nonpositive voltage as the second word line selection signal selecting the word line electrically connected to the word line driver.

2. The apparatus of claim 1, wherein the p-type transistor turns on with only negative gate voltage.

3. The apparatus of claim 1, wherein the depletion mode p-type transistor turns on with a nonpositive gate voltage.

4. The apparatus of claim 1, wherein word line drivers of the plurality of word line drivers have a total of two transistors.

5. The apparatus of claim 1, wherein the n-type transistor is in a p-type well, and the p-type well and the p-type transistor are in an n-type well.

6. The apparatus of claim 1, wherein the bias arrangements of the control circuitry include a second bias arrangement deselecting the word line electrically connected to the word line driver, by applying a negative voltage as the second word line selection signal.

7. The apparatus of claim 1, wherein the bias arrangements of the control circuitry include a second bias arrangement deselecting the word line electrically connected to the word line driver, by applying a positive voltage as the second word line selection signal.

8. The apparatus of claim 1, wherein the bias arrangements of the control circuitry include a second bias arrangement deselecting the word line electrically connected to the word line driver, by applying a negative voltage as the second word line selection signal, and
wherein the bias arrangements of the control circuitry include a third bias arrangement deselecting the word line electrically connected to the word line driver, by applying a positive voltage as the second word line selection signal.

9. The apparatus of claim 1, wherein the p-type transistor turns on with nonpositive gate voltage,
wherein the bias arrangements of the control circuitry include a second bias arrangement deselecting the word line electrically connected to the word line driver, by applying a zero voltage as the second word line selection signal.

10. The apparatus of claim 1, wherein the p-type transistor turns on with nonpositive gate voltage,
wherein the bias arrangements of the control circuitry include a second bias arrangement deselecting the word line electrically connected to the word line driver, by applying a zero voltage as the second word line selection signal,
wherein the bias arrangements of the control circuitry include a third bias arrangement deselecting the word line electrically connected to the word line driver, by applying a positive voltage as the second word line selection signal.

11. The apparatus of claim 1, further comprising:
a negative standby pump generating a negative voltage as the second word line selection signal.

12. An operating method of a memory having a word line driver electrically coupled to a word line, the word line driver having a first transistor and a second transistor coupled to the first transistor, the method comprising steps of:
receiving a first word line selection signal at a first current carrying terminal of the first transistor;
receiving a second word line selection signal at a gate of the first transistor and a gate of the second transistor, wherein the second word line selection signal is coupled to a negative voltage in program or read operation; and
sending an output signal from an output terminal of the word line driver to the word line.

13. The method of claim 12, wherein the p-type transistor turns on with only negative gate voltage.

14. The method of claim 12, wherein the p-type transistor turns on with nonpositive gate voltage.

15. The method of claim 12, wherein word line drivers of the plurality of word line drivers have a total of two transistors.

16. The method of claim 12, wherein the n-type transistor is in a p-type well, and the p-type well and the p-type transistor are in an n-type well.

17. The method of claim 12, wherein bias arrangements of the memory include a second bias arrangement deselecting the word line electrically connected to the word line driver, by applying the negative voltage as the second word line selection signal.

18. The method of claim 12, wherein bias arrangements of the memory include a second bias arrangement deselecting the word line electrically connected to the word line driver, by applying a positive voltage as the second word line selection signal.

19. The method of claim 12, wherein bias arrangements of the memory include a second bias arrangement deselecting the word line electrically connected to the word line driver, by applying the negative voltage as the second word line selection signal, and
wherein the bias arrangements include a third bias arrangement deselecting the word line electrically connected to the word line driver, by applying a positive voltage as the second word line selection signal.

20. The method of claim 12, wherein the p-type transistor turns on with nonpositive gate voltage,
wherein the bias arrangements include a second bias arrangement deselecting the word line electrically connected to the word line driver, by applying a zero voltage as the second word line selection signal.

21. The method of claim 12, wherein the p-type transistor turns on with nonpositive gate voltage,
wherein the bias arrangements include a second bias arrangement deselecting the word line electrically connected to the word line driver, by applying a zero voltage as the second word line selection signal,
wherein the bias arrangements include a third bias arrangement deselecting the word line electrically connected to the word line driver, by applying a positive voltage as the second word line selection signal.

22. The method of claim 12, further comprising:
generating the negative voltage from a negative standby pump as the second word line selection signal.

23. A memory circuit, comprising:
means for receiving, at a word line driver electrically connected to a word line, a first word line selection signal and a second word line selection signal, the first word line selection signal and the second word line selection signal together selecting the word line from a plurality of word lines including:
means for receiving the second word line selection signal at an input terminal electrically connected to a gate of a p-type transistor of the word line driver and a gate of a n-type transistor of the word line driver, the gate of the p-type transistor electrically connected to the gate of the n-type transistor;
means for receiving the first word line selection signal at a first current carrying terminal of the p-type transistor; and
means for sending an output signal from an output terminal of the word line driver to select the word line electrically connected to the word line, the output terminal being electrically connected to a second terminal of the p-type transistor and a second terminal of the n-type transistor, wherein the p-type transistor is a depletion mode p-type transistor and is turned on with a nonpositive gate voltage.

* * * * *